United States Patent [19]

Strohmeier

[11] Patent Number: 4,625,263
[45] Date of Patent: Nov. 25, 1986

[54] ILLUMINATED CONTROL PANEL FOR COMMUNICATION APPARATUS, PARTICULARLY FOR CAR RADIO OR RADIO-RECORDER COMBINATION

[75] Inventor: Wolfgang Strohmeier, Hildesheim, Fed. Rep. of Germany

[73] Assignee: Blaupunkt-Werke GmbH, Hildesheim, Fed. Rep. of Germany

[21] Appl. No.: 810,936

[22] Filed: Dec. 19, 1985

[30] Foreign Application Priority Data

Mar. 27, 1985 [DE] Fed. Rep. of Germany ....... 3511026

[51] Int. Cl.$^4$ .............................................. F21V 7/04
[52] U.S. Cl. ....................................... 362/32; 362/86; 340/815.13
[58] Field of Search ....................... 362/86, 32, 26, 29, 362/30, 23; 340/815.13, 815.31; 116/256, 257; 455/345, 346; 200/314, 315, 317

[56] References Cited

U.S. PATENT DOCUMENTS 3,169,506 2/1965 Morris ................................. 362/339
4,163,883 8/1979 Boulanger ........................... 200/314
4,322,780 3/1982 Murakami et al. .................. 362/86
4,481,512 11/1984 Tscheulin et al. ............. 340/815.13

FOREIGN PATENT DOCUMENTS 2215897 10/1977 Fed. Rep. of Germany ........ 362/61

Primary Examiner—William A. Cuchlinski, Jr.
Assistant Examiner—D. M. Cox
Attorney, Agent, or Firm—Frishauf, Holtz, Goodman & Woodward

[57] ABSTRACT

To provide for easy identification of the location of pushbuttons or other similar operating elements of an automobile radio, even in the dark, light guides which provide for function indication and positioned above the respective pushbuttons extend laterally beyond the respective pushbuttons, and the front surface of the panel is formed with a recessed surface having an inclined portion (23), in light transmitting location to an auxiliary light emitting surface (21) shining, from the light guides, downwardly on the inclined portion (23) to provide for lateral illumination of the push buttons which, then, will appear as shadows between the light emitted from the auxiliary light surfaces.

6 Claims, 3 Drawing Figures

ILLUMINATED CONTROL PANEL FOR COMMUNICATION APPARATUS, PARTICULARLY FOR CAR RADIO OR RADIO-RECORDER COMBINATION

The present invention relates to an illuminated control panel for communication apparatus, and more particularly to a control panel for a car radio, in which control buttons, typically station selector or function selector pushbuttons are illuminated so that their position on the apparatus can be readily determined.

BACKGROUND

Various types of communication equipment, typically car radios, car radio-cassette recorders and the like, have control elements which should be readily operable even though the interior of the vehicle is dark. The various operating elements should be easily and readily accessible and so indicated that finding the respective position of a selected control element is simple and can be determined by visual checking, without relying, only, on "feel". It is well known to install light guides on the front plate of a car radio above the operating elements which carry, at the front, an opaque coating or cover with the respective functions left off, or being transparent, so that the control buttons located beneath the light guide which carries the operating indicia can be easily determined. This arrangement, however, does not positively locate the control buttons which, then, must be found by "feel" if there is no other external illumination available. Arrangements in which light guides provide indication of the function of selected control buttons are difficult to operate in darkness, particularly without distractihg the driver of the vehicle from traffic conditions, rather providing for the driver a clearly marked operating location to press a selected button, for example. In the dark, such buttons cannot be found visually.

It has previously been proposed to supply light guides to the operating buttons themselves, in which the function indications are shown on the buttons themselves. Such arrangements permit immediate accessing of the specific buttons by the operator, for example by an operator's finger, but are complex to make due to the required light coupling to the respective buttons. The additional cost and complexity of such arrangements usually is not warranted.

THE INVENTION

It is an object to provide a control panel for communication apparatus, particularly for car radios, or car audio systems in general, in which control elements, such as control buttons or the like, can be readily located although the buttons themselves are not illuminated.

Briefly, light guides which at their end faces provide for operating indicia, extend laterally beyond the operating elements. The light guides are formed with an auxiliary light emitting surface, positioned below the light emitting facing surface and carrying the indicia. The front plate is formed with a recess having inclined reflective surfaces, laterally adjacent to operating elements, typically pushbuttons, and in the path of light emitted from the auxiliary light emitting surface of the light guide.

The system has the advantage that, without additional structural requirements, the position of the operating elements can readily be determined since they will appear as shadows adjacent the illuminated reflective surface of the front plate, next to the operating elements themselves. The vehicle operator, thus, is not distracted from attention to traffic conditions, nor is the light so bright as to interfere with operation of the vehicle, for example at night time. The operating elements and the associated function indications can be illuminated by a single light guide, so that the overall system is simple and, in effect, can utilize presently used structural arrangements.

DRAWINGS

FIG. 1 illustrates the front plate of an automobile radio, in top view, and showing various alphanumeric function designations. In the Figure, the alphanumeric designations are shown in reversed or negative form, that is, the drawing illustrates, in black lines, regions which, in actual use, would be illuminated, and the field of the light guide is left blank on the drawing although, in actual use, it would be opaque;

FIG. 3.

DETAILED DESCRIPTION

Figure 2:
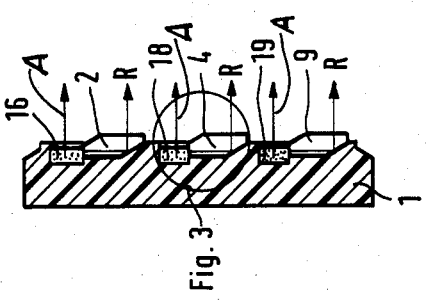
FIG. 2 is a cross-sectional view along line II—II of FIG. 1.
Figure 1:
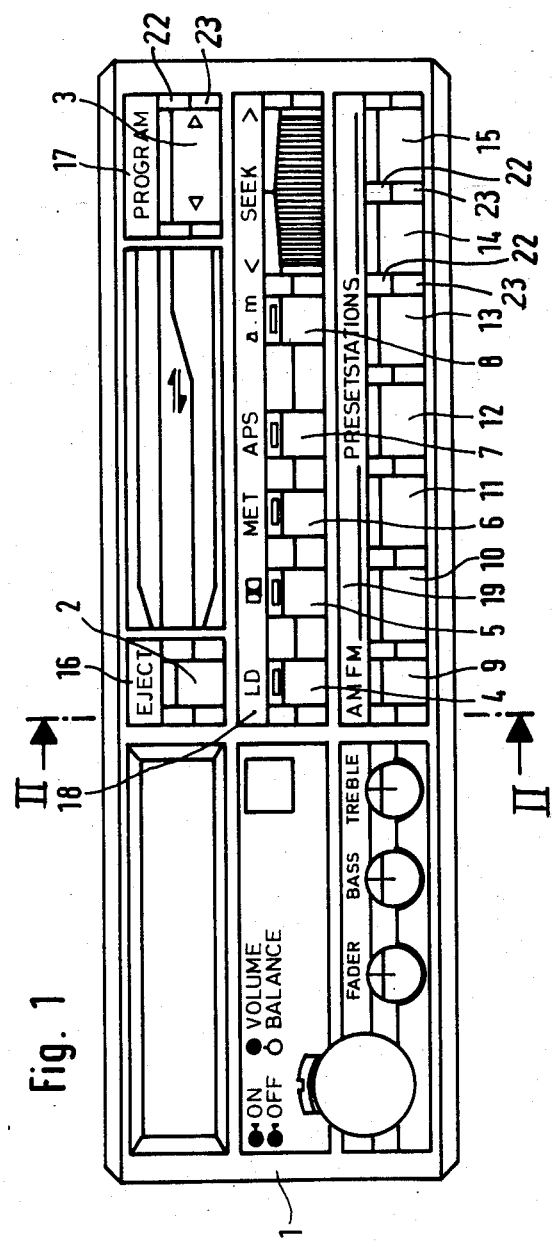

The front plate 1 of a car radio—not further shown—has three rows of operating pushbuttons, located in three vertically staggered groups, namely operating elements 2, 3 in the top row, elements 4–8 in the center row, and elements 9–15, in the bottom row. These elements, typically, are pushbuttons, and/or rocker switches. Light guides 16, 17, 18, 19 are located above the respective operating elements 2, 3; 4–8; and 9–15, associated with the respective operating elements, and, if desired, extending over a portion of a group of operating elements. The width of the end face of the respective light guides 16–19, which is essentially rectangular in cross section, is so dimensioned that the associated operating element 2, 3 or one of the operating elements 4–8; 9–15 is covered and, further, the light guide extends laterally thereover. The entry of light into the light guides themselves is shown and may be in accordance with any suitable arrangement, well known in the art. At the front side of the light guides, that is, at the side terminating at the panel 1, the light guides 16–19 are covered with an opaque coating, from which only the function indication for the respective operating elements 2–15 is left out. The light guides are embedded with their back side and top side in the front plate 1.

Figure 3:
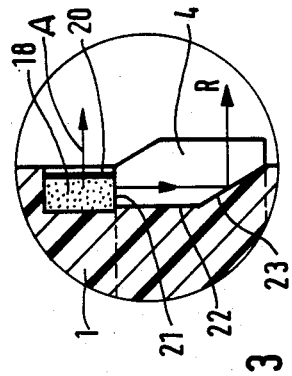
FIG. 3 is an enlarged fragmentary view of the circle indicated in FIG. 2 as s.

In accordance with a feature of the invention, the light guides 16–19 are formed with an auxiliary light emitting surface 21—best seen in FIG. 3, and located at the bottom side thereof. The auxiliary light emitting surface 21 permits only that light to be emitted freely which is not covered by the operating elements 2-15 immediately beneath the respective light guide.

The front plate 1 is formed with a cup-shaped or bowl-shaped recess adjacent the respective operating elements or pushbuttons 2-15. The recess has an essentially straight upper portion extending, for example, over about half the height of the operating pushbuttons 2-15; this portion is joined by an inclined portion 23. The upper portion 22 extends essentially vertically downwardly, and the inclined portion 23, joining the upper portion 22 is formed with a reflective surface.

The reflective surface need not be a mirror surface, smooth plastic is sufficient.

OPERATION

Light fed into the light guides 16–19, in any well known and suitable manner, is emitted on the front face where the front is not opaquely coated, so that the indicia 20 for the respective functions will be apparent. This light is emitted in accordance with the arrows A, see FIG. 2. Additional light is emitted according to the arrows R from the auxiliary light exit surfaces 21. The light which is emitted from the auxiliary surfaces 21 is so reflected by the inclined surface 23 that the operating elements, typically pushbuttons 2–15, will clearly appear as shadows adjacent the illuminated surface 23, and thus can be easily visually localized.

The specification describes the light guides as being located above the operating elements. This is the usual location, since light so emitted then will not blind the driver. In other installations, however, light guides may be located below the pushbuttons or operating elements 2–15, and this mere reversal is within the scope of the invention, forming a mere reversal modification thereof.

Various other changes and modifications may be made within the scope of the inventive concept. For example, surfaces 23 need not be flat but may be curved or part-spherical, or part bowl-shaped.

I claim:

1. Illuminated control panel for communication apparatus, especially automotive audio apparatus, having
    a plurality of operating elements (2–15) located on a panel;
    a plurality of light guides (16–19) located with respect to the elements by at least one of: above the operating elements; below the operating elements, and
    having a light emitting face surface, said face surface carrying function indicating indicia (Eject, Program, Preset Stations, and the like), and
    comprising, in accordance with the invention,
    an arrangement to provide for illumination of the operating elements by said light guides, wherein
    the light guides extend laterally beyond the operating elements and are formed with an auxiliary light emitting surface (21) positioned, respectively, at least: below; above the light emitting face surface, and
    the front plate is formed with a recessed inclined reflecting surface (23) positioned laterally adjacent the operating element and in the path of light (R) emitted from the auxiliary light emitting surface (21),
    the light emitted from the auxiliary light emitting surface being reflected by said reflecting surface (23) to permit perception by an operator of the position of the respective control elements in the form of shadows between the light emitted from the auxiliary light emitting surfaces of the light guides and light reflected by the reflecting surfaces of the front plate.

2. Panel according to claim 1, wherein a plurality of operating elements (4–8; 9–15) are located adjacent each other in a row;
    a common light guide (18, 19) is associated with the operating elements in any one row; and
    wherein the recessed inclined reflecting surfaces (23) are formed as cup-like depressions having an extreme limit opposite the inclined reflective surface which is delimited by the auxiliary light emitting surfaces (21) of the respective light guide.

3. Panel according to claim 2, wherein the light guides (16–19) are formed with an opaque coating at their face surface, from which the function indicia are left free to provide an illuminated function-indicia light output.

4. Panel according to claim 1, wherein the front plate (1) comprises plastic and the recessed inclined reflecting surface (23) comprises a smooth plastic surface.

5. Panel according to claim 1, wherein the light guides are positioned upwardly above the operating elements, and the auxiliary light emitting surface extends downwardly adjacent the operating elements.

6. Panel according to claim 5, wherein the operating elements are pushbuttons or rocker buttons.

* * * * *